(12) United States Patent
VerSteeg et al.

(10) Patent No.: US 12,348,339 B2
(45) Date of Patent: *Jul. 1, 2025

(54) REDUCED-COMPLEXITY INTERNET OF THINGS SENSOR

(71) Applicant: Comcast Cable Communications, LLC, Philadelphia, PA (US)

(72) Inventors: William Carroll VerSteeg, Buford, GA (US); Clyde Robbins, Fort Washington, PA (US); Ross Gilson, Philadelphia, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/047,474

(22) Filed: Oct. 18, 2022

(65) Prior Publication Data

US 2023/0104808 A1 Apr. 6, 2023

Related U.S. Application Data

(63) Continuation of application No. 16/159,062, filed on Oct. 12, 2018, now Pat. No. 11,509,507.

(Continued)

(51) Int. Cl.
| | |
|---|---|
| *H04L 25/03* | (2006.01) |
| *G01D 21/00* | (2006.01) |
| *H03D 7/16* | (2006.01) |
| *H04B 1/401* | (2015.01) |
| *H04B 7/005* | (2006.01) |
| *H04L 1/00* | (2006.01) |

(Continued)

(52) U.S. Cl.
CPC ........ *H04L 25/0384* (2013.01); *G01D 21/00* (2013.01); *H03D 7/165* (2013.01); *H04B 7/005* (2013.01); *H04L 1/0003* (2013.01); *H04W 4/38* (2018.02); *H04B 1/401* (2013.01); *H04L 67/12* (2013.01)

(58) Field of Classification Search
CPC ... H04L 25/0384; H04L 1/0003; H03D 7/165; H04B 7/005; H04B 1/401
See application file for complete search history.

(56) References Cited

U.S. PATENT DOCUMENTS

| | | | |
|---|---|---|---|
| 2006/0048567 A1* | 3/2006 | Shimura | B60C 23/0413 73/146.5 |
| 2006/0080722 A1* | 4/2006 | Santhoff | H04L 25/03834 725/144 |

(Continued)

*Primary Examiner* — Sam K Ahn
*Assistant Examiner* — Amneet Singh
(74) *Attorney, Agent, or Firm* — BakerHostetler

(57) ABSTRACT

A reduced-complexity Internet of Things sensor is disclosed. An example apparatus comprises memory storing one or more sensor event messages, a radio configured to determine a sensor event, a counter configured to output incremental counter states, and a control circuitry. The control circuitry may be in communication with the memory, the radio, and counter, and the sensor. The control circuitry may be configured to determine, based on the sensor event, a select sensor event message of the one or more sensor event messages. The control circuitry may be further configured to output, via the radio signal, a packet comprising the select event message and an indication of a counter state associated with the sensor event message.

20 Claims, 9 Drawing Sheets

Related U.S. Application Data

(60) Provisional application No. 62/573,962, filed on Oct. 18, 2017.

(51) Int. Cl.
*H04L 67/12* (2022.01)
*H04W 4/38* (2018.01)

(56) References Cited

U.S. PATENT DOCUMENTS

| | | |
|---|---|---|
| 2006/0119493 A1 | 6/2006 | Tal et al. |
| 2011/0074596 A1 | 3/2011 | Frohlick et al. |
| 2011/0159863 A1 | 6/2011 | Dai |
| 2014/0293993 A1 | 10/2014 | Ryhorchuk |
| 2015/0256960 A1 | 9/2015 | Chemishkian et al. |
| 2016/0047890 A1* | 2/2016 | Ryan ................... H04W 4/02 398/118 |
| 2016/0373917 A1 | 12/2016 | Logue et al. |
| 2017/0034016 A1* | 2/2017 | Carroll ................. H04L 43/026 |

\* cited by examiner

REDUCED-COMPLEXITY INTERNET OF THINGS SENSOR

CROSS-REFERENCE TO RELATED APPLICATIONS

This application is a continuation of U.S. patent application Ser. No. 16/159,062, filed Oct. 12, 2018, which claims the benefit of U.S. Provisional Application No. 62/573,962, filed Oct. 18, 2017, the contents of which are herein incorporated by reference in their entirety.

BACKGROUND

In a low-power wide-area network (LPWAN), electronic devices (referred to as "end nodes") may operate in a wide variety of use settings to measure, collect, and/or determine data and transmit that data or a related message to other upstream components of the LPWAN. For example, an end node may be configured with a thermometer and deployed to measure the temperature of a space. If the temperature of the space exceeds a threshold, the end node may transmit an alarm message. As another example, an end node may be affixed to a mailed package to detect if and when the package is opened. The end node may transmit a message when the end node detects that the package is opened. An LPWAN may be implemented according to the LoRaWAN™ or other specification. An end node, for example, of such an LPWAN must be configured to operate within the requirements set by that specification.

These and other shortcomings are addressed in the present disclosure.

SUMMARY

Systems and methods are disclosed for a reduced-complexity Internet of Things sensor. An example apparatus comprises memory storing one or more sensor event messages, a radio configured to determine a sensor event, a counter configured to output incremental counter states, and a control circuitry. The control circuitry may be in communication with the memory, the radio, and counter, and the sensor. The control circuitry may be configured to determine, based on the sensor event, a select sensor event message of the one or more sensor event messages. The control circuitry may be further configured to output, via the radio signal, a packet comprising the select event message and an indication of a counter state associated with the sensor event message.

In an example method, a sensor device of a low-power wide-area network may detect a sensor event. A control circuitry of the sensor device may determine, based on the sensor event, a select sensor event message of one or more sensor event messages. The one or more sensor event messages may be stored on memory of the sensor device. A control circuitry of the sensor device may determine a counter value of a plurality of incremental counter values. The counter value may be associated with the sensor event message. A packet comprising the select sensor event message and an indication of the counter value may be output via a radio signal output by the sensor device.

BRIEF DESCRIPTION OF DRAWINGS

The accompanying drawings, which are incorporated in and constitute a part of this specification, illustrate embodiments and together with the description, serve to explain the principles of the methods and systems.

DETAILED DESCRIPTION

Figure 1:
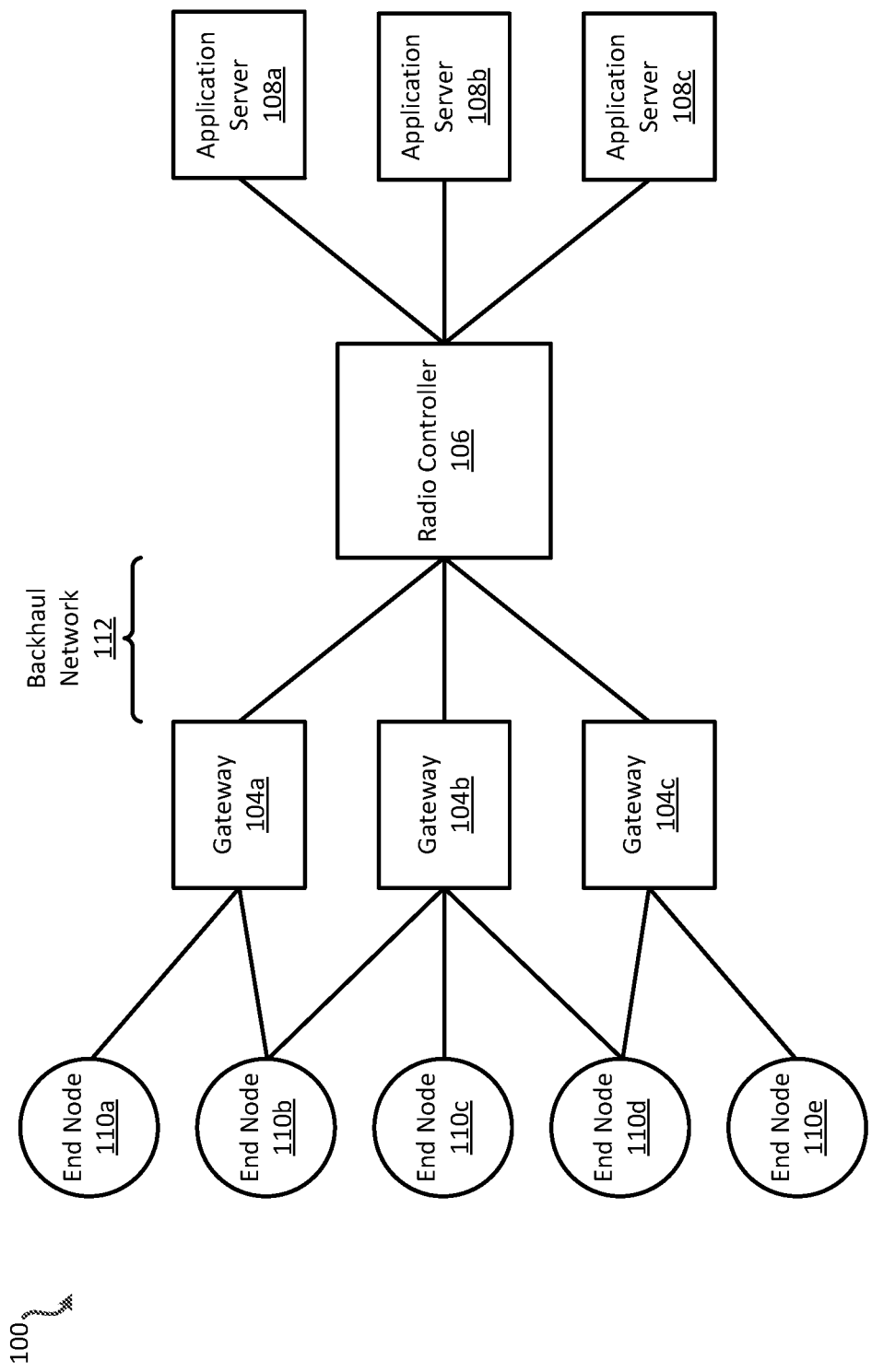
FIG. 1 illustrates a block diagram of an example system.

The systems and methods of the present disclosure relate to a reduced-complexity end node (e.g., sensor) for use in a low power wide area network (LPWAN). The end node may be configured with memory storing pre-computed data that has been determined before the end node is deployed or activated for use. The pre-computed data may replace data that otherwise would have been determined "on the fly," while the end node was deployed in the field for use. Accordingly, the end node with the pre-computed data may be configured without a CPU or similar processor.

The pre-computed data may comprise a plurality of pre-computed messages that the end node may select for transmission by the end node. The pre-computed message packets may be organized into a plurality of sets of pre-computed message packets. Each set of pre-computed message packets may correspond with information that the end node may potentially determine to transmit. When the end node determines that a message packet should be sent to indicating certain information, the end node may select a set of pre-computed message packets that corresponds to that information. In an example, an end node may be configured to determine if a temperature exceeds a threshold. Thus, the sets of pre-computed message packets may comprise a first set indicating that the threshold is exceeded and a second set indicating that the threshold is not exceeded. If the end node determines that the temperature is exceeded, the end node may select the set of pre-computed message packets indicating as such.

Each set of pre-computed message packets may comprise one or more pre-computed message packets, each comprising a sequence number. A sequence number represents the relative place of a message packet in an ordered sequence of message packets transmitted from the end node to another computing device. The end node tracks the sequence number of the end node's most recent transmission to the computing device. When the end node determines that a pre-computed message packet from a set should be transmitted to a destination computing device, the end node may select, from the set, a pre-computed message packet comprising a sequence number that is greater than the previous sequence number used by the end node for its most recent transmission to the destination computing device.

The pre-computed message packet may comprise payload data indicating the substantive information that the end node has determined to convey. The pre-computed message packet may comprise a message packet header. The header may comprise a MIC (message integrity code), which may also be referred to as a MAC (message authentication code). The MIC may be used to authenticate the message packet with respect to the authenticity of the sender and the integrity of the message packet. The pre-computed message packet may comprise a checksum for the payload, which may be used to determine the integrity of the payload data and detect any errors in the payload. The pre-computed message packet may be in the form of a digital representation of a final waveform for the pre-computed message.

The pre-computed data may comprise waveform data indicating a set of different frequencies/channels via which to transmit a radio frequency (RF) signal representing pre-computed message packet. The number of frequencies/channels may be based on the specification of the LPWAN and/or government regulation. When the end node determines to transmit a message packet and selects a pre-computed message packet, the end node may randomly or pseudo-randomly select a frequency/channel from the set. The end node may use the selected frequency/channel to generate and transmit the RF signal.

The RF signal may be generated according to one or more control circuitry configurations. In a first example, the pre-computed message packet is converted in real time from a digital representation of the waveform into an analog RF signal. For example, the pre-computed message packet is separately passed through two digital-to-analog converters (DAC) followed by (still separately) two low pass filters (LPF). A frequency signal is transmitted to a sine quadrature oscillator cosine to determine a sine wave output and a cosine wave output. The signals from the two LPFs and the respective outputs from the analog Quadrature Modulator (e.g., a sine quadrature oscillator cosine) undergo respective multiplication operations. The results from the multiplication operations are summed and processed by a LPF to determine a RF output.

In a second example of the control circuitry configuration, the control circuitry performs the modulation in the digital domain. The digital representation is then converted to analog and transmitted.

In a third example of the control circuitry configuration in which the pre-computed message is stored in a digital waveform, the digital waveform is passed through a DAC and a LPF.

FIG. 1 illustrates various aspects of an example system 100 in which the present methods, devices, and systems may operate. One skilled in the art will appreciate that provided herein is a functional description and that the respective functions may be performed by software, hardware, or a combination of software and hardware.

The system 100 may be or comprise a low power wide area network (LPWAN). The system 100 may comprise one or more end nodes 110a-e in communication with one or more application servers 108a-b via one or more gateways 104a-b and a radio controller 106.

As will be described in greater detail herein, the end nodes 110a-e may be configured with memory storing pre-computed data. The pre-computed data may comprise message packets and/or waveform data. The end nodes 110a-e may draw from those pre-computed message packets when transmitting a message packet. For example, the pre-computed message packet may comprise payload data, authentication data associated with the payload data, data for verification and authentication of the message packet, and a sequence number associated with the message packet. The end nodes 110a-e may generate and transmit a radio frequency (RF) signal based, at least in part, on the waveform data. For example, the waveform data may comprise one or more frequencies on which the frequency of the RF signal may be based. As another example, the pre-computed data may comprise one or more digital representations of a final waveform to be sent.

Additionally or alternatively, the end nodes 110a-e may be configured without a CPU and/or microcontroller unit (MCU) in favor of control circuitry.

As used herein, "pre-computed data" or the like may be defined as a data that is stored in the end node's 110a-e memory before the end node 110a-e is deployed or activated for use. For example, the end node 110a-e may be configured for implantation within the ground to detect the presence of termites near the end node 110a-e. In this case, the pre-computed message packet or other data may be stored in the end nodes 110a-e before the end node 110a-e is implanted in the ground.

The system 100 (e.g., an LPWAN) and/or operations thereof may comply with a specification and/or standard associated with an LPWAN. For example, the system 100 may be implemented according to the LoRaWAN™ specification. Additionally or alternatively, the LPWAN may comply with a standard or specification relating to communications (e.g., encryption and/or sequence numbering) between components of the system 100. For example, wireless communication between the end nodes 110a-e and the gateways 104a-c may comply with the Advanced Encryption Standard (AES), such as AES-128, AES-192, and/or AES-256.

The end nodes 110a-e (which will be referred to in non-specific contexts as end node 110) may be configured to collect and exchange data according to various functions. For example, the end node 110 may be configured with a temperature sensor and positioned in a room or other space to measure the ambient temperature of the space. The end node 110 may thereafter transmit the data indicative of the temperature. In another example, the end node 110 may be configured with a moisture sensor and located in a basement of a residence. If the end node 110 detects the presence of moisture or water, the end node 110 may transmit data indicative of (or not) the detection of moisture of water. The data transmitted by the end node 110 need not indicate a specific value measured or collected by the end node 110. Instead, the data may indicate that the measured or collected value satisfies (e.g., exceeds, is below, is within, or is outside, as the case may be) a pre-defined threshold or threshold range.

In addition or alternative to data collection or measurement functions, the end node 110 may be configured to effectuate an action or function, which may be in response to received data and/or data determined by the end node 110. For example, an end node 110 may be incorporated within a light source and may activate or deactivate the light source. This end node 110 may additionally or alternatively transmit data indicating the activated or deactivated state of the light source. As evidenced by the above examples, the end nodes 110 may find use in a wide variety of settings and uses, including building and home automation, transportation, agriculture, retail, industry, supply chain management, manufacturing, healthcare, public utilities, and scientific research.

The end node 110 may be configured in a reduced-complexity implementation. For example, the end node 110 may be configured without a CPU, MCU, or the like (referred to herein simply as a "CPU"). Instead, the end node 110 may comprise control circuitry that performs at least some of the functionality that otherwise would have fallen to the CPU.

The memory of the end node 110 may store pre-computed data, such as pre-computed message packets, pre-computed waveform data, and/or pre-computed digital representations of final waveforms. The pre-computed data may be based on an anticipated use of the end node 110. In an example, use of the pre-computed data may enable, at least in part, the omission of the CPU from the end node 110.

As a generic example, a CPU of a conventionally-configured end node may ordinarily access or receive an input and determine an output (e.g., a data file or object) based on the input. The output from the CPU may be used, at least in part, by the conventionally-configured end node to perform one or more functions. For example, the CPU of a conventionally-configured end node may generate a message packet real or near-real time when that end node determines that the message packet be sent. Yet, the pre-computed data of the end node 110, configured without a CPU, may represent output data that otherwise would have been determined by a CPU. In the above example regarding the CPU-determined message packet, the pre-computed data stored in the memory of the end node 110 may comprise some or all of the CPU-determined message packet.

The pre-computed data need not directly correspond with or substantively mirror what would have been determined by a CPU of the end node 110. The pre-computed data may comprise or be data that may be used by the end node 110 or component(s) thereof to achieve the same or similar result or functionality as would be the case using the CPU output.

The system 100 may comprise a radio controller 106. The radio controller 106 may be embodied as one or more interconnected computing devices, such as servers and/or networking devices. As will be discussed further herein, the radio controller 106 may serve to facilitate and coordinate communication between the end nodes 110 and the application servers 108a-c. For example, the interaction between the gateways 104 and the end nodes 110 may be coordinated by the radio controller 106. As such, the radio controller 106 may provide intelligence relating to data packets transmitted between the end nodes 110 and the gateways 104a-c, including, as some examples, scheduling acknowledgments, performing security and data integrity functions, and managing data transmission rates between the end nodes 110 and gateways 104a-c.

The system 100 may comprise one or more application servers 108a-c (which will be referred to in non-specific contexts as application servers 108). The application servers 108 each may be embodied as one or more interconnected computing devices, such as servers or networking devices. The application servers 108 may receive and/or collect data from the end nodes 110. The application servers 108 may interact with the end nodes 110 (via the radio controller 106 and the fixed gateways 104 and/or mobile gateways 102) and perform a function relating to that interaction with the end nodes 110. As will be appreciated due to the wide variety of potential types and functions of the end nodes 110, the operations performed by the application servers 108 are equally broad. As one example, the application servers 108 may receive data collected by the end nodes 110, process and store that data, and/or transmit or present the processed date in some form. For example, an application server 108 may receive data from an end node 110 indicating that the end node's 110 water detector has detected water. The application server 108 may transmit a communication, such as a text or email, to an end user notifying them of such.

The system 100 may comprise one or more gateways 104a-c (which will be referred to in non-specific contexts as gateways 104) which may facilitate communication between the end nodes 110 and upstream components, such as the radio controller 106 and application servers 108.

A gateway 104 may be in wireless communication (e.g., via radio signals) with one or more end nodes 110. As such, the gateway 104 may receive data (e.g., one or more data packets) from the end node 110 and/or transmit data (e.g., one or more data packets) to the end node 110. The gateways 104 may each be geographically positioned to enable communication between the gateway 104 and one or more end nodes 110. In FIG. 1, for example, the gateway 104a is in communication with the end nodes 110a and 110b. The gateway 104b is in communication with the end nodes 110b, 110c, and 110d. The gateway 104c is in communication with the end nodes 110d and 110e.

The positioning of each of the gateways 104 may be based, at least in part, on the wireless communication ranges of the end nodes 110. 114 that the gateways 104 is intended to service. In particular, a wireless communication range of an end node 110 is based, at least in part, on the transmit power of the end node 110 and the power source of the e. It is contemplated that a more dense distribution of the gateways 104 may allow for reduced communication ranges of the end nodes 110, which, in turn, may allow for reduced transmit power requirements for the end node 110. Therefore, the end nodes 110 may be each configured with a less costly power source (e.g., battery), realizing additional cost savings for each end node 110.

The gateway 104 may be in communication with the radio controller 106, via a backhaul network 112, to relay data from the end nodes 110 to the application servers 108 or other upstream components. Conversely, the gateways 104 may relay data from the radio controller 106 or other upstream components to the end nodes 110. The backhaul network 112 may comprise a wireless network, a wired network, or some combination thereof.

As used herein, "upstream" generally refers to the data flow direction starting at the end nodes 110 and leading to the application servers 108 (i.e., left to right in FIG. 1). Depending on context, an "upstream" descriptive modifier may also refer to the components of the system 100 that correspond to this upstream direction of data flow. That is, the application servers 108 are upstream of the radio controller 106, the radio controller 106 is upstream of the gateways 104, and the gateways 104 are upstream of the end nodes 110. Conversely, "downstream" refers to the dataflow direction (or a corresponding descriptive modifier of a component), starting at the applications servers 108 and leading to the end nodes 110 (i.e., right to left in FIG. 1).

Communication between the end nodes 110, the gateways 104, and other components of the system 100 may be performed as follows. It is contemplated that the end nodes 110 may be configured to transmit data to one or more gateways 104 or other components, yet not be configured to receive data from the gateways 104 or other components. In other words, the end nodes 110 may be configured for one-way outbound data communication only. The disclosure, however, is not so limited. In other examples, the end nodes 110 may be configured for bi-directional communication with, for example, the gateway 104 or other components.

An end node 110 may initiate an uplink communication with one or more gateways 104. The uplink communication may be event driven, such as if the end node 110 sensed a particular event or received a particular input. Additionally or alternatively, the uplink communication may be initiated according to a schedule, which may be determined and/or maintained by the end node 110. The schedule may comprise a random component. For example, the schedule may indicate that the uplink communication is to be sent at a pre-determined time plus a small randomly determined or pseudo-randomly determined time offset.

To initiate uplink communication with one or more gateways 104, the end node 110 may send an uplink message packet to one or more gateways 104. The uplink message packet may comprise a payload, a header, a Message Integrity Check (MIC), and/or a checksum associated with the payload. A sequence number may be sent to the gateway 104, either as part of the uplink message packet or along with the uplink message packet.

The payload may comprise the data intended to be transmitted to one or more application servers 108, such as data collected by a sensor of the end node 110 or data indicating that a sensor of the end node 110 was triggered.

The header may comprise metadata describing various aspects of the uplink message packet and/or the payload. For example, the MIC (or other similar authentication datatype) may comprise a portion of the header and may serve to authenticate the uplink message packet. The checksum (or similar data type) may be used to check the integrity of the payload. For example, the checksum may be used to determine whether the payload contains any errors, such as during transmission or storage. The MIC and/or the checksum may comply with the AES-128 specification.

In general, the sequence number may represent a monotonically-incrementing number. As an illustrative example, the sequence number is incremented or increased for each message packet transmitted from a source device (e.g., the end node 110) to a destination device (e.g., the gateway 104). The sequence number may be tracked by one or more of the source device and the destination device. For example, the sequence number of the most recent message packet from the source device to the destination device may be tracked by the source device and the destination device. A new message packet may comprise an incremented or increased sequence number. When the message packet is received by the destination device, the destination device may compare the sequence number in the received message packet with the sequence number tracked by the destination device. If the sequence number from the message packet is greater than the destination device's sequence number, the message packet is processed as normal. If the sequence number from the message packet is equal to or less than the destination device's sequence number (i.e., does not conform with an expected sequence number), this may indicate that the message packet is a repeated or duplicated message packet. In such case, the destination device may discard or disregard the message packet. Sequence numbers may be used to detect and prevent replay or playback attacks in which a malicious third party intercepts an original message packet. The third-party may re-transmit the original message packet in an attempt to gain access to or disrupt the destination device.

Here, the gateway 104 may compare the sequence number from the instant uplink message packet with the current sequence number tracked by the gateway 104. If the sequence number from the uplink message packet is greater than the sequence number tracked by gateway 104, the gateway 104 may accept the uplink message packet and proceed as normal. In concert with the end node 110 transmitting the uplink message packet and the gateway 104 receiving the uplink message packet, each may increment their respective sequence number for use in subsequent transmissions.

If the end node 110 is configured for bi-directional communication and after the end node 110 transmits the uplink message packet, the end node 110 may open one or more successive receive windows during which a downlink message packet may be received by the end node 110 and from the gateway 104. For example, a first receive window may be a one-second time interval from the time that the uplink message packet was transmitted and a second receive window may be a two-second time interval starting from the end of the first receive window.

The gateway 104 may receive the uplink message packet and relay the uplink message packet over the backhaul network 112 to the radio controller 106. The radio controller 106 may receive the uplink message packet and perform various operations to coordinate and process the uplink message packet. For example, the radio controller 106 may determine if redundant uplink message packets were received (since more than one gateway 104 may receive and relay the uplink message packet). As another example, the radio controller 106 may verify the integrity and security of the payload, such as via the checksum included in the uplink message packet.

If the end node 110 is configured for bi-directional communication, the radio controller 106 may schedule an acknowledgement to be sent back to the end node 110. The acknowledgement may be a MAC layer acknowledgement. As such, the radio controller 106 may select one of the gateways 104 that previously relayed the uplink message packet to thereby relay a downlink message packet to the end node 110 in response to the uplink message packet. Thus, while the uplink message packet may be relayed by multiple gateways 104, the downlink message packet may instead be relayed to the end node 110 by only a single gateway 104.

The downlink message may be similar to the uplink message packet. However, such messages may be independent and/or dissimilar. The downlink message packet may comprise a header, a payload, a MIC and/or a checksum. The payload may contain data intended to be delivered to the end node 110. The downlink message packet may further comprise an acknowledgement to a previously received uplink message packet. The acknowledgement may be a MAC layer acknowledgement, which may indicate that the uplink message packet from the end node 110 was successfully received by the gateway 104 and/or the radio controller 106. The acknowledgement (and/or another coterminous acknowledgement) may be an application layer acknowledgement, which may indicate that an uplink message packet, or portion thereof, was successfully received by one or more of the application servers 108. For example, the application layer acknowledgement may be with respect to a previous uplink message packet from the end node 110, including an immediately previous uplink message packet from the end node. It will be noted that the downlink message packet may comprise an acknowledgement without a payload. That is, the downlink message packet may serve as an acknowledgement to an uplink message packet without including any substantive data.

With the uplink message packet having been received by the radio controller 106, the radio controller 106 may transmit the uplink message packet and/or the data contained in the payload of the uplink message packet to one or more application servers 108. The application servers 108 may use the data for various purposes according to the particular function being implemented.

If the end node 110 is configured for bi-directional communication, and if appropriate for the particular function implemented by the end nodes 110 and application servers 108 (e.g., the function requires bi-directional communication between the end nodes 110 and the application servers 108), the application servers 108 may transmit data to the radio controller 106 for ultimate delivery to one or more of the end nodes 110. The data may be in the form of a downlink message packet or other form. As already noted, the downlink message packet from the application server 108 may comprise an application layer acknowledgement indicating that the application server 108 successfully received the uplink message packet, or portions thereof, from the end node 110. The radio controller 106 may receive the data and, if necessary, format it as a downlink message packet including the data as a payload.

The radio controller 106 may hold the downlink message packet until an uplink message packet is received from the destination end node 110, which indicates that the end node 110 has opened one or more receive windows. In another example, the downlink message packet need not be held by the radio controller 106 and instead may be transmitted further downstream upon receipt by the radio controller 106.

The radio controller 106 may select one of the gateways 104 and transmit the downlink message packet to the selected gateway 104 with instructions for the gateway 104 to further transmit the downlink message packet to the destination end node 110. The selection of the fixed gateway 104 may be based on the downlink capacity of the gateways 104, for example. The gateway 104 may receive the downlink message packet and transmit it to the end node 110, preferably within one of the end node's 110 receive windows.

Figure 2:
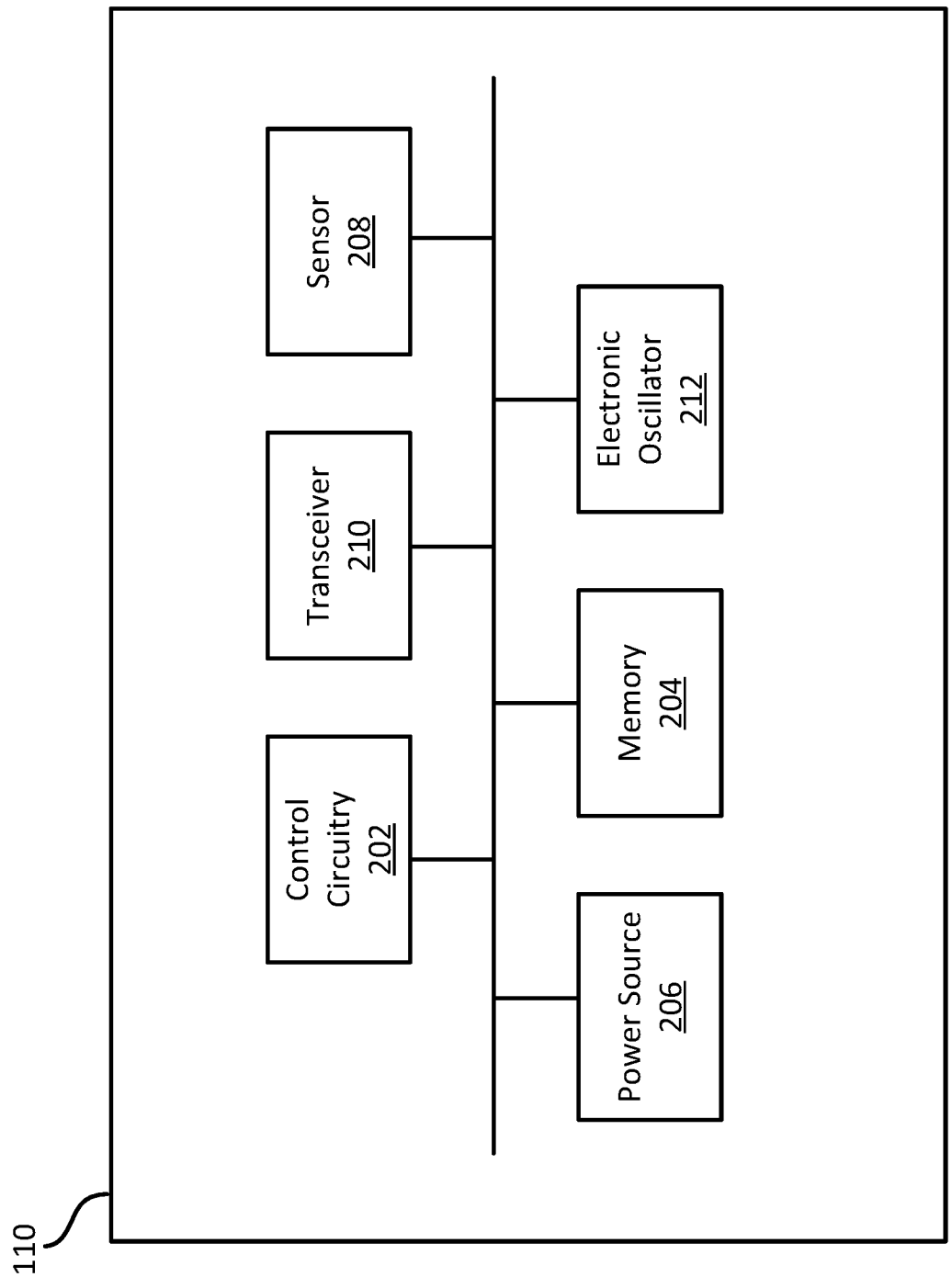
FIG. 2 illustrates a block diagram of an example computing device.

FIG. 2 illustrates an example end node 110 (FIG. 1) in a reduced complexity configuration. The end node 110 may comprise control circuitry 202, memory 204, a sensor 208, a transceiver 210, an electronic oscillator 212, and a power source 206. The control circuitry 202 may be configured to effectuate, at least in part, one or more operations disclosed herein. The control circuitry 202 may comprise, as some examples, one or more low-pass filters, one or more digital-to-analog converters (DACs), and one or more quadrature oscillators, as well as various other circuitry components. Example control circuit configurations are described elsewhere herein. The memory 204 may comprise programmable memory. Additionally or alternatively, the memory 204 may be non-volatile. Examples of memory 204 may comprise EEPROM memory or flash memory (or other types of solid state memory). The memory 204 may store the pre-computed message data packets, pre-computed digital waveforms, and other data usable to effectuate the operations described herein. The memory 204 and data stored thereon will be described further herein. The electronic oscillator 212 may comprise a crystal oscillator, for example.

The sensor 208 of the end node 110 may be realized in a variety of forms according to the particular function of the end node 110. As some examples, the sensor 208 may comprise a thermometer, a moisture or humidity sensor, a light sensor, a motion sensor, an accelerometer, a pressure-sensitive sensor (e.g., a button or switch), a termite sensor, and/or an electromagnetic field sensor. While many examples discussed herein concern an end node 110 equipped with only a single sensor 208, the disclosure is not so limited and the end node 110 may comprise any number of sensors 208.

The sensor 208 may be configured to measure or detect a state of a binary pair of states. For example, a pressure-sensitive sensor (e.g., a button) may detect if the pressure-sensitive sensor has been pressed or has not been pressed. Other sensors 208 may be configured to measure or detect a state from more than two possible discrete states. For example, a door security sensor may determine a door's state as one of the following: open; closed and locked; or closed and unlocked.

Other sensors 208, such as a thermometer, may measure a continuous, or near continuous, range of values (i.e., states). One or more threshold values or value ranges may delineate the continuous range of possible values into a more manageable number of possible states. For example, a temperature threshold range may be defined for temperatures measured by a thermometer. A measured temperature below the lower bound of the threshold range may indicate a first state (temperature is too cold). A temperature above the upper threshold bound of the threshold range may indicate a second state (temperature is too hot). Yet, a temperature within the threshold range may indicate a third state (temperature is okay). This delineation of a continuous set of possible states may be beneficial with respect to the memory's 204 storage requirements since each potential message may need to be pre-computed and stored. In any of the above cases regarding the different ranges of possible states, some subset of the states may be designated as "alarm" or other designator. As will be described below, the schedule by which an end node 110 transmits an uplink message packet may be based on the state of the sensor 2086 or end node 110, such as if the state was considered an "alarm" state.

The transceiver 210 may enable wireless communication between the end node 110 and the gateways 104 (or other components). For example, the transceiver 210 may be configured to communication via Wi-Fi or other IEEE 802.11 standard. Additionally or alternatively, the transceiver 210 may be configured to communicate via an IEEE 802.15.4 standard, which may be suitable for low rate and low power transmission systems.

Figures 3A, 3B:
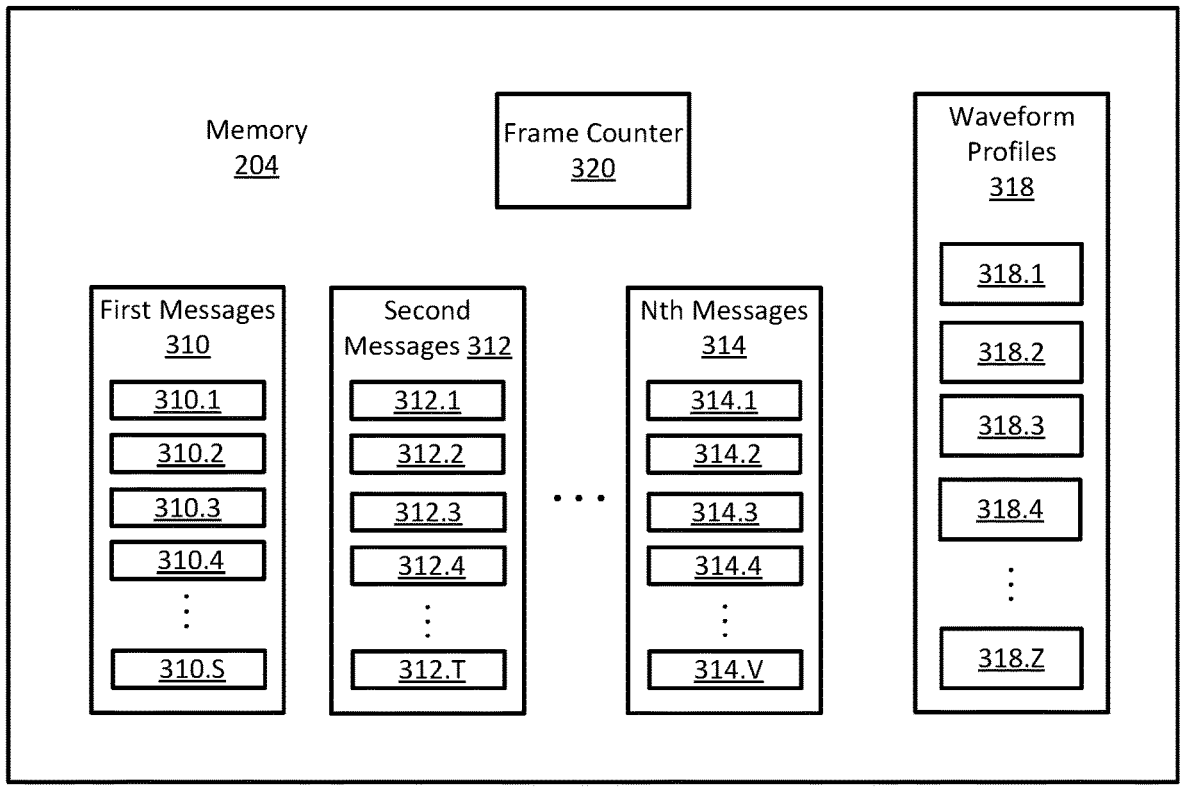
FIG. 3A illustrates a data object diagram of an example memory.
FIG. 3B illustrates a data representation diagram.

FIG. 3A illustrates the memory 204 (FIG. 2) and an example of the data stored thereon. The data may comprise two or more sets of messages (i.e., sets of message packets). The data may additionally or alternatively comprise a set of waveform profiles 318 and a frame counter 320.

The two or more sets of messages may comprise a first set of messages 310, a second set of messages 312, and up to an Nth set of messages 314. (It is explicitly contemplated that exactly two sets of messages may be used, rather than the three sets shown in FIG. 3A.) Each set of messages may correspond with a possible state of the end node 110 (e.g., the state of the sensor 208).

Each of the messages of the several sets may be pre-computed with at least sufficient information to obviate the need for a CPU to build the message in real time. For example, each message of a set may be pre-computed with a payload that indicates the state of the end node 110 that corresponds to that set of messages. Each of the messages may additionally comprise a pre-computed header, a pre-computed MIC, and a pre-computed checksum associated with the respective payload also may be pre-computed for the message. A sequence number may be pre-computed for the message. As indicated above, a sequence number is provided with a message packet to avoid replay attacks that capture a packet and attempt to resend it at a later time.

In an example, a temperature sensor has a defined threshold range in which temperatures below the lower bound of the threshold range are considered too cold (a first state) and deemed an alarm event. The temperatures above the upper limit of the threshold range are considered too hot (a second state) and are considered an alarm event. The temperatures within the threshold range are deemed acceptable (a third state) and do not indicate an alarm. Thus, in this example, the first set of messages 310 may correspond to the first state in which the temperature is too low and each of those messages 310.1-310.S may comprise a pre-computed payload that indicate that the temperature is below the threshold range. The second set of messages 312 may correspond to the second state in which the temperature is too high and each of the messages 312.1-312.T in the second set may comprise a pre-computed payload that indicates that the temperature is above the threshold range. The Nth (third) set of messages 314 may correspond with the third state in which the temperature is within the threshold range. The messages 314.1-314.V in the Nth set of messages 314 each may comprise a pre-computed payload that indicates that the temperature is within the threshold range. It will be appreciated that the sets of messages 310, 312, 314 need not comprise equal numbers of messages since there may be variations between the message sets with respect to transmission frequency, expected number of alarm instances, and other considerations.

The memory 204 may comprise the set of waveform profiles 318 which, in turn, may comprise waveform profiles 318.1-318.Z. Each waveform profile 318.1-318.Z may indicate one or more waveform characteristics accordingly to which a message (e.g., a message from the first, second, and/or Nth sets of messages 310, 312, 314) may be transformed and transmitted by the end node 110 as an analog radio signal. A waveform characteristic indicated in each of the waveform profiles 318.1-318.Z may comprise a frequency or frequency channel over which the message may be transmitted. In an example, the waveform profiles may each comprise digital waveform representations. Each digital waveform representation may represent or otherwise indicate a frequency or frequency channel over which the message may be transmitted.

The number of waveform profiles in the set of waveform profiles 318 may align with the regulations and other legal restrictions imposed by a jurisdiction in which the system 100 operates. The number of waveform profiles may be additionally or alternatively based on the specification and/or protocol of the system 100. For example, government regulations may require that the end nodes 110 may only transmit over a frequency and/or channel of frequencies that is pseudo-randomly selected from a pool of preselected frequencies/channels. The number of preselected frequencies/channels from which to pseudo-randomly select may be 8, 16, 32, etc. In preparing to transmit a message, reference may be made to a memory address, such as the memory address of the message that is to be sent. If, for example, there are eight frequencies/channels available for pseudo-random selection, the upper three bits of the memory address of the message may be used to make that selection of the frequency/channel (with the binary range of 000-111 over the three bits providing the eight possible frequency/channel selections).

As indicated above, the memory 204 may store the frame counter 320, a representation of which is illustrated in FIG. 3B. The frame counter 320 may comprise a monotonically-increasing frame counter value, which is represented in the column 324. The sequence numbers used in the transmissions from the end node 110 may generally correspond with the frame counter values. As each transmission from the end node 110 is performed, the frame counter is generally incremented by 1 (or more in the event that one or more frame counter values were skipped in the previous transmission). As such, the frame counter 320 may be used to coordinate and select the pre-computed message and/or digital waveform (described in relation to FIG. 4) to transmit, particularly with respect to the sequence number.

The frame counter 320 may comprise information that describes each of the pre-computed messages and/or digital waveforms and indicates the respective sequence number and end node 110 state (e.g., temperature being too high) with which they are already pre-computed. Such information and interrelationships may be visually represented, at least in part, in the chart shown in FIG. 3B (which is merely representative in scope). For example, the marked entries in the column 325 associated with the low temperatures may indicate that the memory 204 stores messages that indicate as such for sequence numbers 5 and 10 (which correspond with frame counter values 5 and 10). The column 327 provides the same with respect to messages indicating an alarm that the temperature is too high. The column 326 is associated with the "no alarm" state and the entries down the column 326 reflect that the memory 204 stores messages with payloads indicating the "no alarm" state and with all sequence numbers except for 5 and 10.

In an example operation, an entire first time interval may pass without detection of an alarm state the sensor 208. The frame counter 320 indicates that a pre-computed message comprising a payload indicating the no-alarm state is stored in the memory 204. The end node 110, therefore, may transmit this pre-computed message with the sequence number of 0.

Additionally or alternatively, a message scheduling may be based on whether a detected state is considered an "alarm" or not. For example, if a state is not considered an alarm (or if the state is simply that no state change or other event was detected) the message may be transmitted by the end node 110 at the end of the time interval. If an alarm state is detected, the end node 110 may transmit the message immediately rather than waiting for the end of the time interval.

Continuing the example operation, no alarm state is again detected during the second time interval. With reference again to the frame counter 320, the end node 110 may transmit the pre-computed message comprising the payload indicating the no-alarm state and sequence number 1. During a third time interval, the sensor 208 does detect that the temperature has dropped below the lower bound of a threshold range. With reference to the frame counter 320, there is no stored pre-computed message that comprises a payload indicating the low temperature alarm state until that corresponding with frame counter value 5. Due to the lack of pre-computed message, the frame counter 320 may skip over frame counters values 2, 3, and 4 to frame counter value 5. The end node 110 may transmit the pre-computed message comprising the payload indicating the low temperature alarm state and the sequence number 5. During the next time interval, which otherwise would have corresponded to the frame counter value 6 even if not strictly chronologically so, there is again no alarm state detected. In this instance, the pre-computed messages corresponding to frame counter values 2, 3, and 4 and indicating the no-alarm state may not be used since those sequence numbers are less than the sequence number 5 that was previously transmitted. Thus, the stored pre-computed message comprising the non-alarm status payload and the sequence number 6.

In an additional or alternative example, which may be similar in some aspects to the frame counter 320 and associated operations described in relation to FIGS. 3A and 3B, except that the sequence number system and requirements may be altered. The operation of the end node 110 and frame counter 320 in particular may be correspondingly adjusted. Instead of requiring that the sequence number of a message packet must be greater than that in the previous message packet, the sequence numbering system may require that the sequence number of a message packet be different than those previously received. This may allow the frame counter 320 to go back in the frame counter order and use any message packets with sequence numbers that were passed over in the frame counter order.

For example, in the operation described in relation to FIG. 3B, the sensor 208 detected that the temperature dropped below the threshold range in the third time interval. The frame counter 320 skipped over frame counter values 2, 3, and 4 (and associated messages) in favor of frame counter value 5 because the memory 204 did not have a pre-computed message indicating the low temperature with sequence numbers 2, 3, or 4.

In this example, the frame counter 320 may transmit a message with a sequence number that has not yet been used regardless of whether it is greater than or less than that of the previous message. Thus, instead of leaving frame counter values 2, 3, and 4 (and associated messages indicating the no-alarm state) unused, the frame counter 320 may later transmit a pre-computed message with any of sequence numbers 2, 3, or 4. The pre-computed messages corresponding to these frame counter values may be pre-computed message indicated a no-alarm state. For example, in the time interval that would otherwise correspond with frame counter value 6, the end node 110 may determine a no-alarm state. Instead of transmitting a message with sequence number 6, the end node 110 may transmit the unused pre-computed message associated with the frame counter value 2 (i.e., the pre-computed no-alarm message with sequence number 2). The same may occur with respect to frame counter values 3 and 4 and their associated pre-computed messages indicating the no-alarm state.

The pre-computed message packets stored in memory 204 may additionally or alternatively be adjusted. For example, the pre-computed message in each set of pre-computed message may comprise pre-computed messages with sequence numbers that are distinct from the sequence numbers of the pre-computed message of another set of pre-computed messages. For example, the first set of pre-computed messages 310 comprise pre-computed messages with sequence number from 1-100. The second set of pre-computed messages 312 may comprise pre-computed messages with sequence numbers from 101-200. The Nth set of pre-computed messages 314 may comprise pre-computed messages with sequence numbers from 201-300. Accordingly, there will be no instance in which a sequence number of a message is the same as that of another message.

Figure 4:
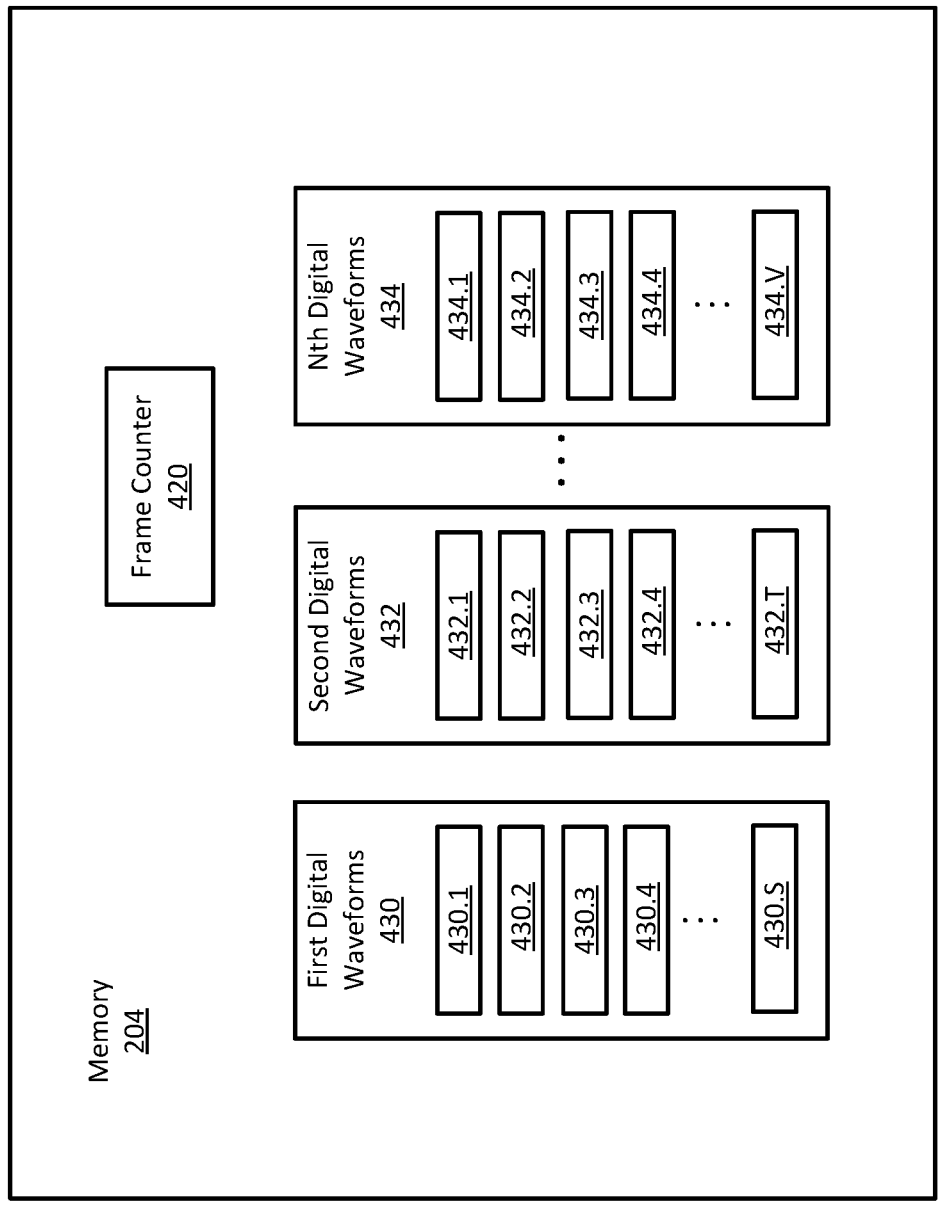
FIG. 4 illustrates a data object diagram of an example memory.

FIG. 4 illustrates the memory 204 (FIG. 2) and a second example of data stored thereon, which comprises two or more sets of digital representations of waveforms (hereinafter "digital waveforms") and a frame counter 420. The two or more sets of digital waveforms may comprise a first set of digital waveforms 430 (comprising digital waveforms 430.1-430.S), a second set of digital waveforms 432 (comprising digital waveforms 432.1-432.T), and up to an Nth set of digital waveforms 334 (comprising digital waveforms 434.1-434.V). (It is again noted that exactly two sets of digital waveforms are explicitly contemplated rather than the three sets illustrated in FIG. 4.)

Each of the first, second, and Nth digital waveform sets 430, 432, 434 may correspond with a respective possible state of the end node 110 (e.g., of the sensor 208). For example, each of the digital waveforms 430.1-430.S of the first digital waveform set 430 may indicate a first state of the end node 110. Each of the digital waveforms 432.1-432.T of the second waveform set 432 may indicate a second state of the end node 110. Each of the digital waveforms of the Nth digital waveform set 434 may indicate an Nth state of the end node 110.

Returning to the example thermometer sensor in which temperature measurements may be trifurcated by a threshold range, the first set of digital waveforms 430 may correspond with the state of the end node 110 in which the measured temperature is less than the lower bound of the threshold range. The second set of digital waveforms 432 may correspond with the state of the end node 110 in which measured temperature is greater than the upper bound of the threshold range. The Nth set of digital waveforms may correspond with the state of the end node 110 in which the measured temperature is within the threshold range.

The frame counter 420 may be similar in some aspects to the frame counter 320 of FIGS. 3A and 3B, except that the frame counter 420 refer to digital waveforms instead of pre-computed messages.

Figure 5:
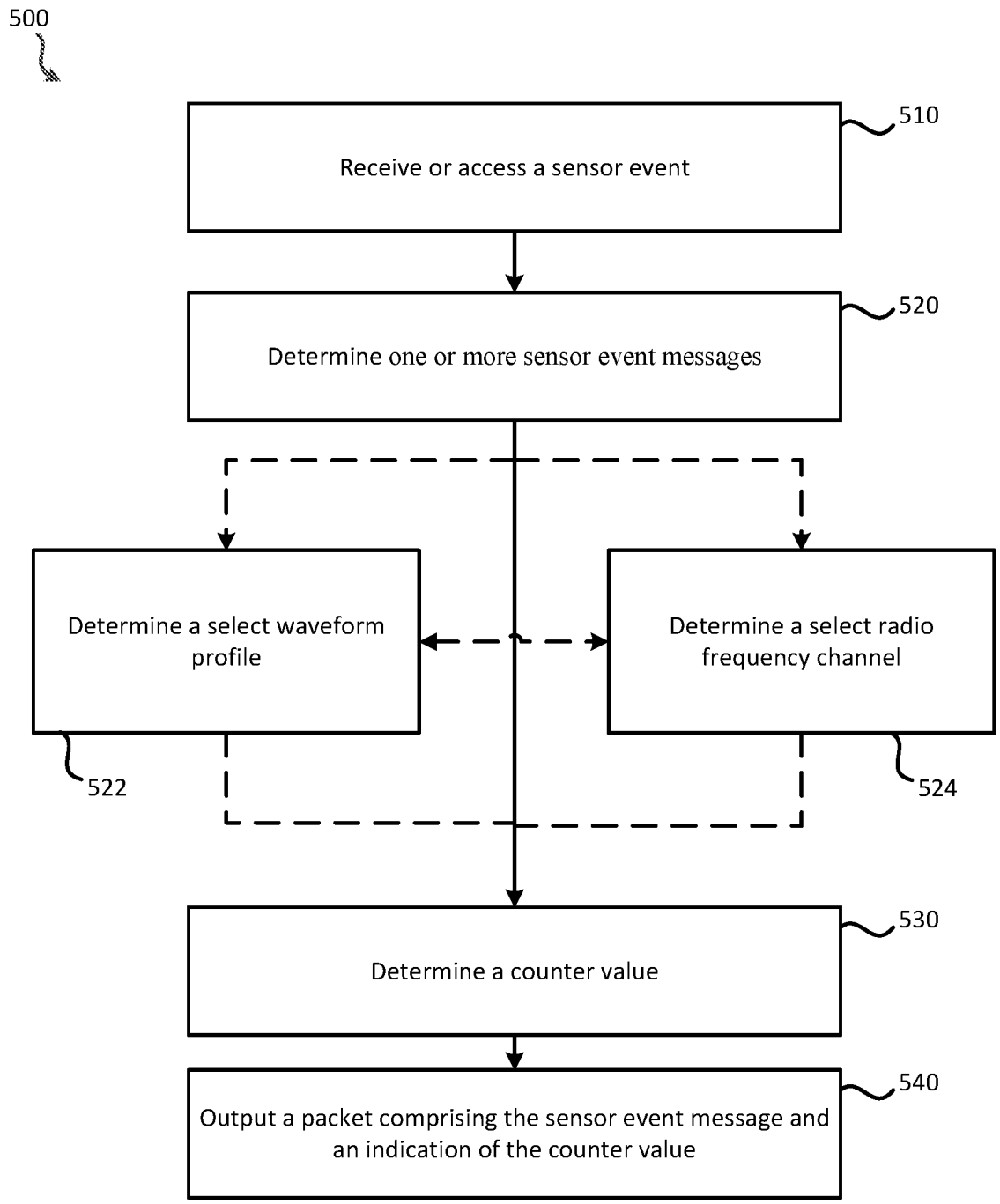
FIG. 5 illustrates an example method.

FIG. 5 illustrates an example method. In operation or step 510, a sensor event may be received or accessed (e.g., detected). The sensor event may be detected by a device or end node such as a sensor device of a low-power wide-area network. The sensor event may comprises a state change of the sensor device. The sensor event may comprises a change in value of an attribute measured by the sensor device. The sensor event may comprise a value measured by the sensor device satisfying a threshold value.

Operation or step 520 comprises determining a select sensor event message of one or more sensor event messages. The one or more sensor event messages may be determined by a control circuitry of the sensor device and/or may be based on the sensor event. The one or more sensor event messages may be stored on memory of the sensor device.

Operation or step 530 comprises determining a counter value of a plurality of incremental counter values. The counter value may be determined by a control circuitry of the sensor device. The counter value may be associated with the sensor event message; and Operation or step 540 comprises outputting a packet comprising the select sensor event message and an indication of the counter value. The packet may be outputted via a radio signal output by the sensor device. The packet may comprise a payload indicative of the select sensor event message. The packet may comprise a payload checksum associated with the payload. The packet may comprise a packet header. The packet may comprise a message integrity check. Additionally or alternatively, a pseudo-random time offset may be determined, and the outputting the packet may be based on the pseudo-random time offset.

Additionally or alternatively, in operation or step 522, a select waveform profile may be determined. The select waveform may be determined from one or more waveform profiles stored on the memory of the sensor device. The select waveform profile may comprise a digital representation of a waveform of the radio signal. The select waveform profile may correspond with the select sensor event message, and the outputting the packet operation may be based on the select waveform profile. The outputting the packet may comprise modulating the radio signal based on the select waveform profile. The select waveform profile may comprise a digital representation of a waveform of the radio signal. The modulating the radio signal may further comprises modulating the digital representation of the waveform of the radio signal. The modulating the radio signal may comprise converting a modulated digital representation of the waveform resulting from the modulating the digital representation of the waveform to analog. The modulating the radio signal may comprise: converting the digital representation of the waveform to an analog representation of the waveform; and passing the analog representation of the waveform through an analog quadrature modulator.

Additionally or alternatively, in operation or step 524, a select radio frequency channel may be determined. The select radio frequency channel may be determined from a plurality of radio frequency channels. The plurality of radio frequency channels (e.g., indications or representation of the channels) may be stored on the memory of the sensor device. The packet (e.g., radio signal) may be output via the select radio frequency channel. The determining the select radio frequency channel is based on a memory location in the memory, wherein the memory is associated with at least one of the select sensor event message and the select waveform profile.

Figure 6:
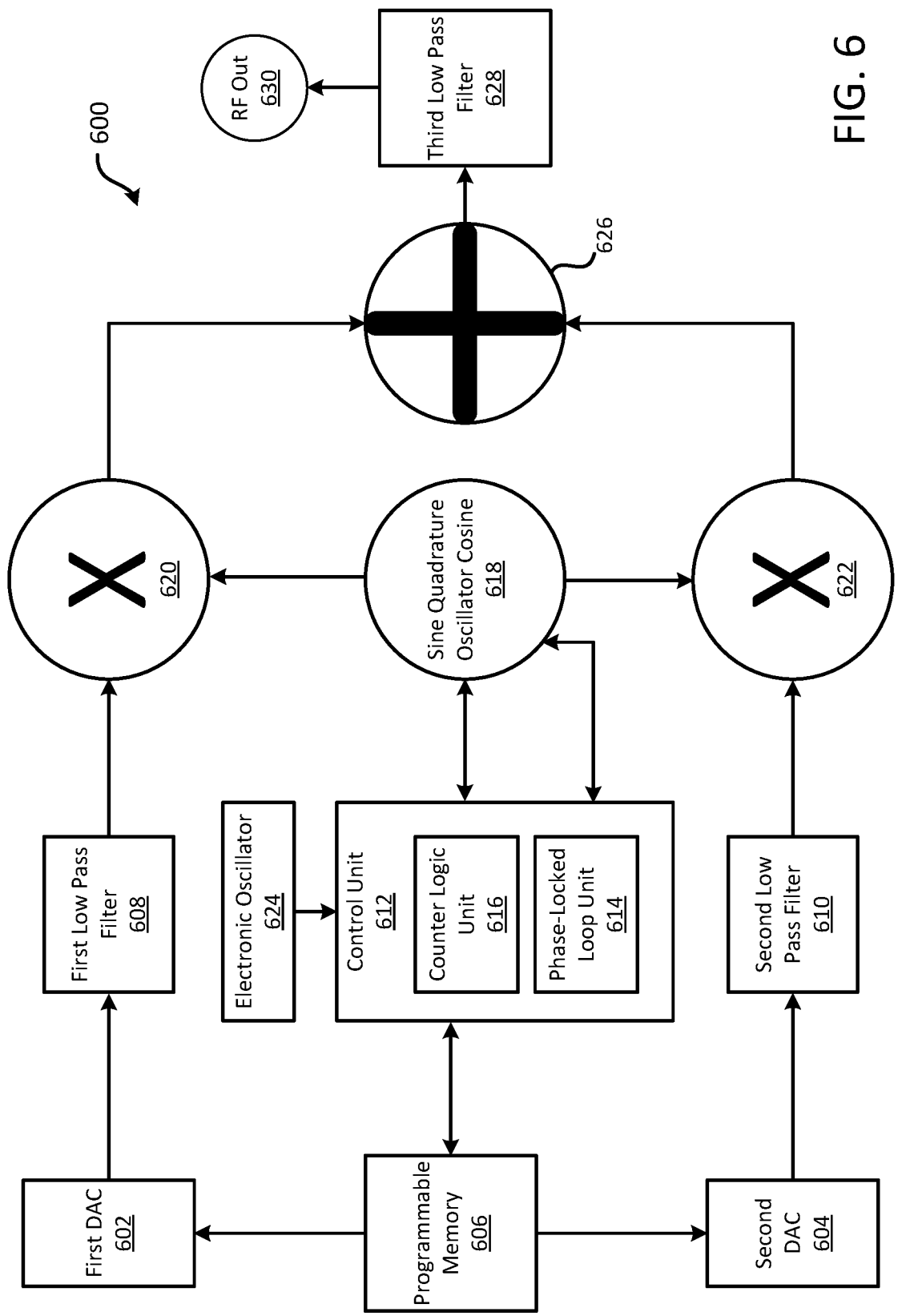
FIG. 6 illustrates a schematic diagram of at least a portion of example control circuitry.

FIG. 6 illustrates an example configuration of a control circuitry 600 in which a pre-computed message packet is converted in real time from a digital representation of the waveform into an analog RF signal. The control circuitry 600 may be used in conjunction with data represented in the memory 204 of FIGS. 3A and 3B. An electronic oscillator 624 may provide a timing signal to a control unit 612. The electronic oscillator 624 may comprise a crystal oscillator, for example. The control unit 612 may comprise a counter logic unit 616 and a phase-locked loop unit 614. The phased-locked loop unit 614 may receive the timing signal from the electronic oscillator 624 and synchronize the timing signal with that of the phased-locked loop unit 614. Additionally or alternatively, the phased-lock loop unit 614 may output a signal that is a multiple of the timing signal from the electronic oscillator 624.

Data from programmable memory 606 may be accessed according to a signal from the control unit 612 and/or the counter logic unit 616. For example, the counter logic unit 616 may track the frame counter and/or the current value of the frame counter. The counter logic unit 616 may determine and transmit a signal to the programmable memory 606 identifying a pre-computed message (or memory address thereof) for processing by the control circuitry 600 and output as an RF signal. The data representing the pre-computed message may pass through a first digital-to-analog converter (DAC) 602 and a first low pass filter 608. Separately, the data representing the pre-computed message may pass through a second DAC 604 and a second low pass filter 610.

The control unit 612 (e.g., the counter logic unit 616) may transmit a signal to a quadrature oscillator, such as the sine quadrature oscillator cosine 618, representing a frequency. The frequency may correspond to a select frequency indicated in the waveform profiles 318 (FIG. 3A) and/or be based on the select frequency indicated in the waveform profiles 318. The signal representing the frequency may be processed by the quadrature oscillator to determine two output signals.

A first output signal may represent a sine wave output and a second output may represent a cosine wave output. The first output signal from the sine quadrature oscillator cosine 618 and the output signal from the first low pass filter 608 may undergo a multiplication operation by a first multiplication unit 620. The second output signal from the sine quadrature oscillator cosine 618 and the output signal from the second low pass filter 610 may also undergo a multiplication operation by a second multiplication unit 622. The results of both multiplication units 620, 622 may undergo a summing operation by a summing unit 626. The result of the summing operation may be processed by a third low pass filter 628 to determine and/or generate the RF Out signal 630.

Figure 7:
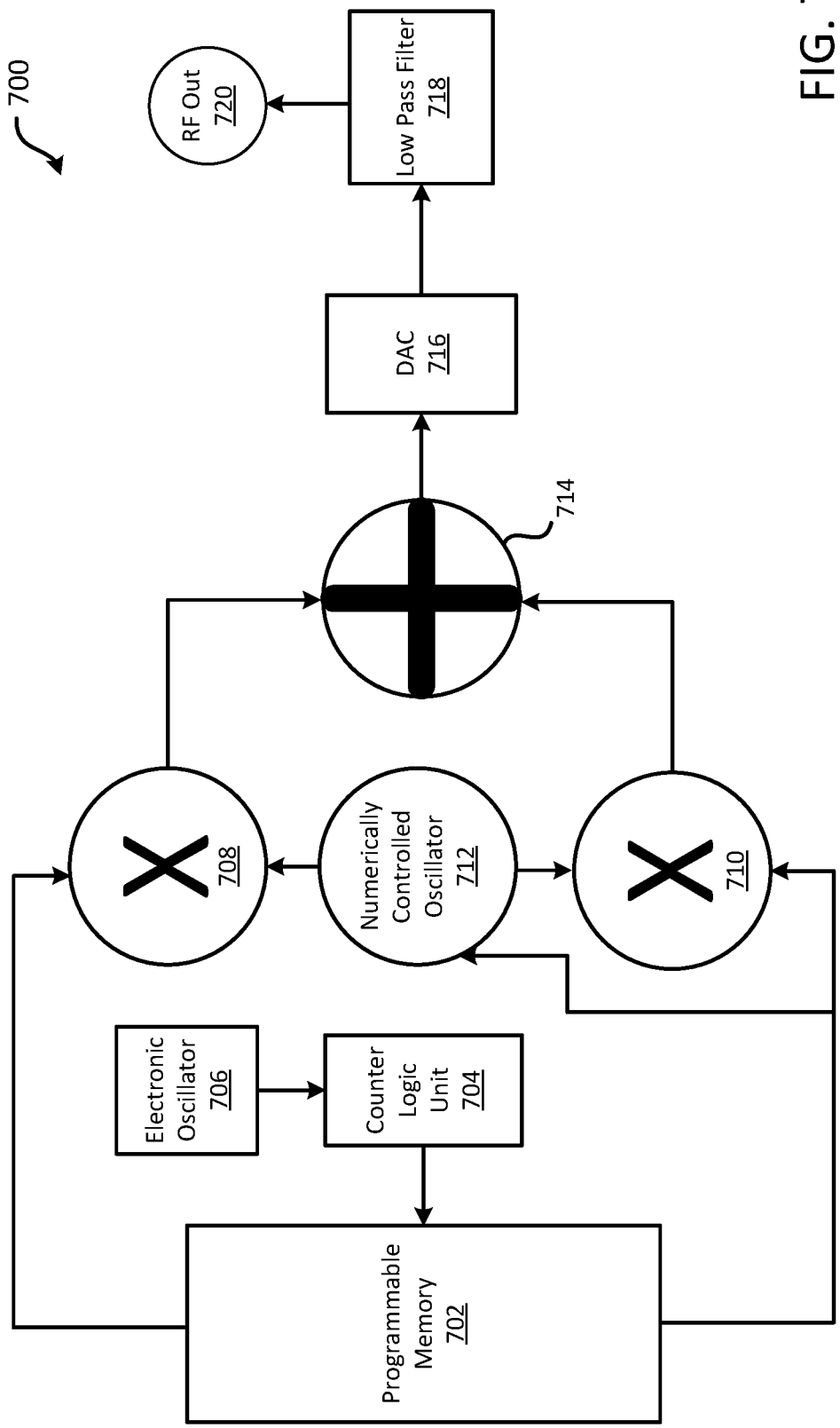
FIG. 7 illustrates a schematic diagram of at least a portion of example control circuitry.

FIG. 7 illustrates an example configuration of a control circuitry 700 in which the control circuitry performs the modulation in the digital domain. The digital representation is then converted to analog and transmitted. The control circuitry 700 may be used in conjunction with data represented in the memory 204 of FIGS. 3A and 3B. The control circuitry 700 may comprise an electronic oscillator 706 that may provide a timing signal to a counter logic unit 704. The electronic oscillator 706 and the counter logic unit 704 may be similar in some aspects with the electronic oscillator 624 and the counter logic unit 616 of FIG. 6, respectively.

Data from programmable memory 702 may be accessed according to a signal from the counter logic unit 704. The counter logic unit 704 may determine and transmit a signal to the programmable memory 702 identifying a pre-computed message (or memory address thereof) for processing by the control circuitry 700 and output as an RF signal. A signal from the programmable memory 702 may be transmitted to a numerically controlled oscillator 712. This signal may indicate a frequency. The frequency may correspond to a select frequency indicated in the waveform profiles 318 (FIG. 3A) and/or be based on the select frequency indicated in the waveform profiles 318.

Based on the signal from the programmable memory 702, the numerically controlled oscillator 712 may generate a first signal and a second signal. The programmable memory 702 may provide a signal that may be based on and/or indicate a pre-computed message. The pre-computed message may be based on the signal provided by the counter logic unit 704. The signal from the programmable memory 702 and the first signal from the numerically controlled oscillator 712 may undergo a multiplication operation by a first multiplication unit 708. The signal from the programmable memory 702 and the second signal from the numerically controller oscillator 712 may undergo a multiplication operation by a second multiplication unit 710. The results from both multiplication operations may undergo a summing operation by a summing unit 714. The result of the summing operation may pass through a DAC 716. The resultant analog signal may pass through a low pass filter 718 to determine and/or generate a RF Out signal.

Figure 8:
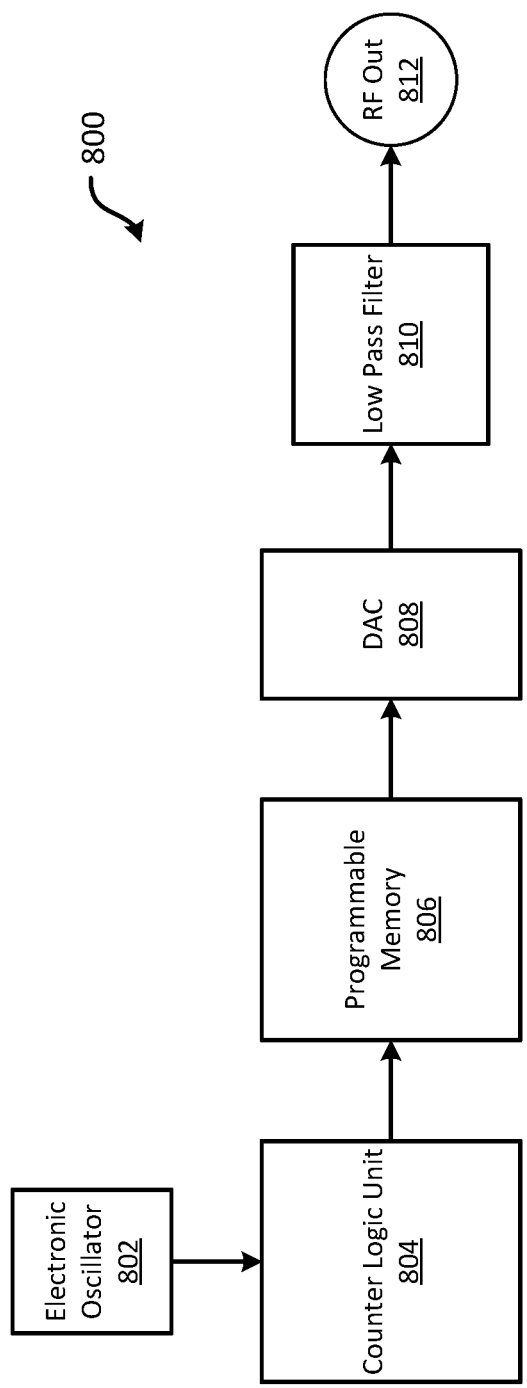
FIG. 8 illustrates a schematic diagram of at least a portion of example control circuitry.

FIG. 8 illustrates an example configuration of a control circuitry 800 in which a pre-computed message is stored in a digital waveform and the digital waveform is passed through a DAC and a LPF. The control circuitry 800 may be used in conjunction with the data stored in the memory 204 and described in relation to FIG. 4. The control circuitry 800 may comprise an electronic oscillator 802 that may provide a timing signal to a counter logic unit 804, which both may be similar in some aspects with the electronic oscillator 624 and the counter logic unit 616 of FIG. 6, respectively.

Data from programmable memory 806 may be accessed according to a signal from the counter logic unit 804. For example, the counter logic unit 804 may track the frame counter and/or the current value of the frame counter. The counter logic unit 804 may determine and transmit a signal to the programmable memory 806 identifying a pre-computed message (or memory address thereof) for processing by the control circuitry 800 and output as an RF signal. The pre-computed message may comprise a digital representation of the pre-computed message, such as those in the first, second, or Nth sets of digital waveforms 430, 432, and 434 (FIG. 4).

The data from the programmable memory 806 may be transmitted to a DAC 808. The analog signal from the DAC 808 may pass through a low pass filter 810 and output as an RF Out signal 812.

Figure 9:
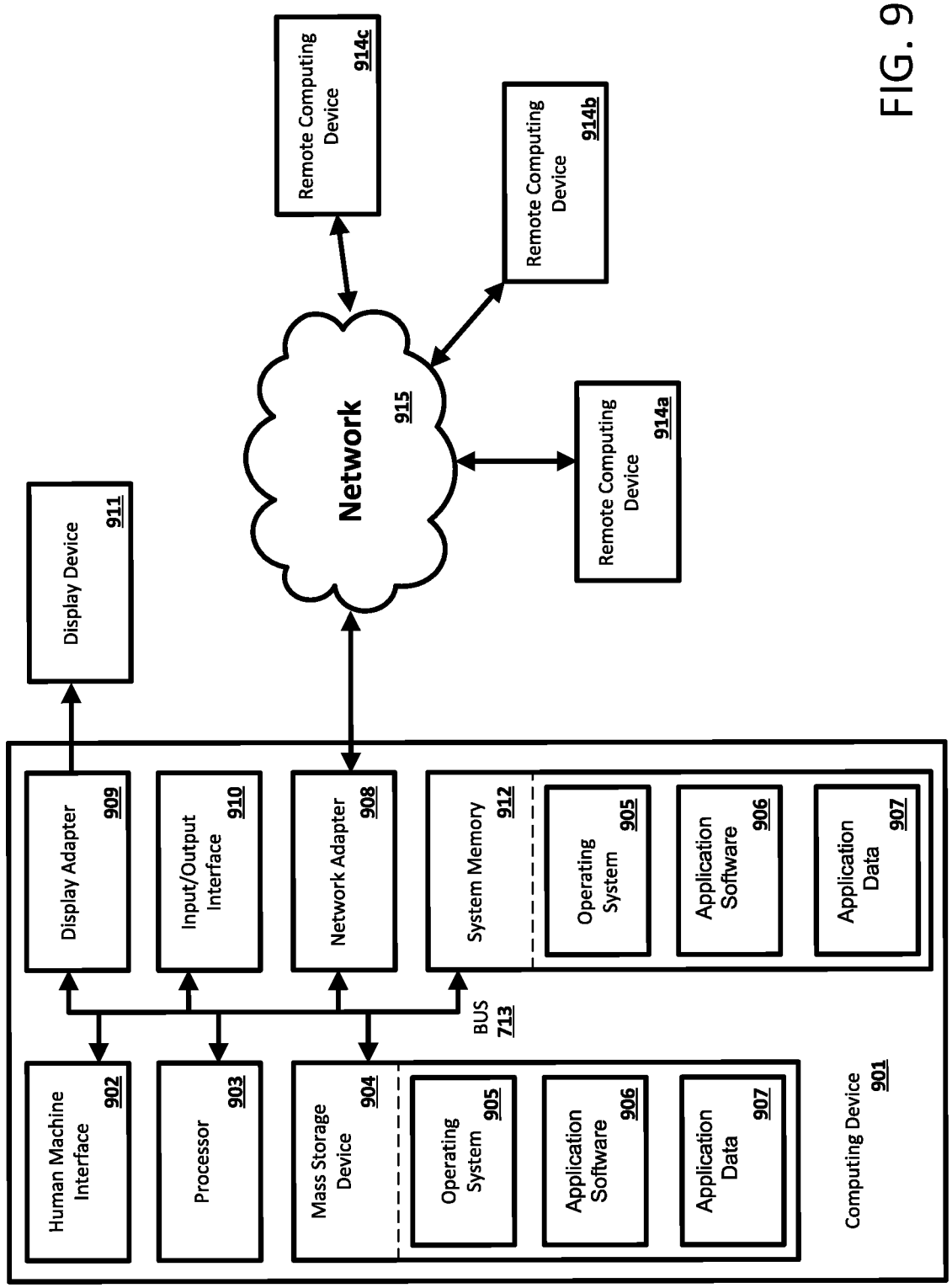
FIG. 9 illustrates a block diagram of an example computing device.

The methods and systems may be implemented on a computing device such as a computing device 901 (e.g., computer) as illustrated in FIG. 9 and described below. By way of example, the gateways 104, the radio controller 106, and/or the application servers 108 of FIG. 1 may be a computing device as illustrated in FIG. 9. Similarly, the methods and systems disclosed may utilize one or more computing device to perform one or more functions in one or more locations. FIG. 9 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems may be operational with numerous other general purpose or special purpose computing system environments or configurations. Examples of well-known computing systems, environments, and/or configurations that may be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems may be performed by software components. The disclosed systems and methods may be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods may also be practiced in grid-based and distributed computing environments where tasks are performed by remote processing devices that are linked through a communications network. In a distributed computing environment, program modules may be located in both local and remote computer storage media including memory storage devices.

Further, one skilled in the art will appreciate that the systems and methods disclosed herein may be implemented via a general-purpose computing device in the form of a computing device 901. The components of the computing device 901 may comprise, but are not limited to, one or more processors 903, a system memory 912, and a system bus 913 that couples various system components including the processor 903 to the system memory 912. In the case of multiple processors 903, the system may utilize parallel computing.

The system bus 913 represents one or more of several possible types of bus structures, including a memory bus or memory controller, a peripheral bus, an accelerated graphics port, and a processor or local bus using any of a variety of bus architectures. By way of example, such architectures may comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 913, and all buses specified in this description may also be implemented over a wired or wireless network connection and each of the subsystems, including the processor 903, a mass storage device 904, an operating system 905, a service software 906, a service data 907, a network adapter 908, system memory 912, an Input/Output Interface 910, a display adapter 909, a display device 911, and a human machine interface 902, may be contained within one or more remote computing devices 914a,b,c at physically separate locations, connected through buses of this form, in effect implementing a fully distributed system.

The computing device 901 typically comprises a variety of computer readable media. Exemplary readable media may be any available media that is accessible by the computing device 901 and comprises, for example and not meant to be limiting, both volatile and non-volatile media, removable and non-removable media. The system memory 912 comprises computer readable media in the form of volatile memory, such as random access memory (RAM), and/or non-volatile memory, such as read only memory (ROM). The system memory 912 typically contains data such as service data 907 and/or program modules such as operating system 905 and service software 906 that are immediately accessible to and/or are presently operated on by the processor 903.

The computing device 901 may also comprise other removable/non-removable, volatile/non-volatile computer storage media. By way of example, FIG. 9 illustrates a mass storage device 904 which may provide non-volatile storage of computer code, computer readable instructions, data structures, program modules, and other data for the computing device 901. For example and not meant to be limiting, a mass storage device 904 may be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules may be stored on the mass storage device 904, including by way of example, an operating system 905 and service software 906. Each of the operating system 905 and service software 906 (or some combination thereof) may comprise elements of the programming and the service software 906. Service data 907 may also be stored on the mass storage device 904. Service data 907 may be stored in any of one or more databases known in the art. Examples of such databases comprise, DB2®, Microsoft® Access, Microsoft® SQL Server, Oracle®, mySQL, PostgreSQL, and the like. The databases may be centralized or distributed across multiple systems.

The user may enter commands and information into the computing device 901 via an input device (not shown). Examples of such input devices comprise, but are not limited to, a keyboard, pointing device (e.g., a "mouse"), a microphone, a joystick, tactile input devices such as gloves, and other body coverings, and the like. These and other input devices may be connected to the processor 903 via a human machine interface 902 that is coupled to the system bus 913, but may be connected by other interface and bus structures, such as a parallel port, game port, an IEEE 1394 Port (also known as a Firewire port), a serial port, or a universal serial bus (USB).

A display device 911 may also be connected to the system bus 913 via an interface, such as a display adapter 909. It is contemplated that the computing device 901 may have more than one display adapter 909 and the computing device 901 may have more than one display device 911. For example, a display device may be a monitor, an LCD (Liquid Crystal Display), or a projector. In addition to the display device 911, other output peripheral devices may comprise components such as speakers (not shown) and a printer (not shown) which may be connected to the computing device 901 via Input/Output Interface 910. Any step and/or result of the methods may be output in any form to an output device. Such output may be any form of visual representation, including, but not limited to, textual, graphical, animation, audio, tactile, and the like. The display 911 and computing device 901 may be part of one device, or separate devices.

The computing device 901 may operate in a networked environment using logical connections to one or more remote computing devices 914*a,b,c*. By way of example, a remote computing device may be a personal computer, portable computer, smartphone, a server, a router, a network computer, a peer device or other common network node, and so on. Logical connections between the computing device 901 and a remote computing device 914*a,b,c* may be made via a network 915, such as a local area network (LAN) and a general wide area network (WAN). Such network connections may be through a network adapter 908. A network adapter 908 may be implemented in both wired and wireless environments. Such networking environments are conventional and commonplace in dwellings, offices, enterprise-wide computer networks, intranets, and the Internet.

For purposes of illustration, application programs and other executable program components such as the operating system 905 are illustrated herein as discrete blocks, although it is recognized that such programs and components reside at various times in different storage components of the computing device 901, and are executed by the data processor(s) of the computer. An implementation of service software 906 may be stored on or transmitted across some form of computer readable media. Any of the disclosed methods may be performed by computer readable instructions embodied on computer readable media. Computer readable media may be any available media that may be accessed by a computer. By way of example and not meant to be limiting, computer readable media may comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by a computer.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, may be implemented by computer program instructions. These computer program instructions may be loaded on a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, may be implemented by special purpose hardware-based computer systems that perform the specified functions or steps, or combinations of special purpose hardware and computer instructions.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that may be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that may be performed it is understood that each of these additional steps may be performed with any specific embodiment or combination of embodiments of the disclosed methods.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations may be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

The invention claimed is:

1. An apparatus comprising:
   a memory storing:
      a plurality of sensor event messages;
      one or more waveform profiles, wherein each waveform profile of the one or more waveform profiles is associated with one of the plurality of sensor event messages; and
      a plurality of radio frequency channels;
   a sensor configured to determine a sensor event; and
   a controller configured to communicate with the memory and the sensor, wherein the controller is further configured to:
      select, based on the sensor event, a sensor event message of the plurality of sensor event messages, wherein each of the plurality of sensor event messages is generated and stored with an associated sequence number in the memory prior to detection of the sensor event, wherein the associated sequence number is configured to indicate a relative place of the sensor event message in an ordered sequence of the plurality of sensor event messages to facilitate detection of a misuse of the sensor event message;
      determine, based on the sensor event message, a select waveform profile of the one or more waveform profiles;
      determine, based on a memory location associated with the sensor event message or the select waveform profile, a select radio frequency channel from the plurality of radio frequency channels; and
      output, based on the select waveform profile, via a radio signal on the select radio frequency channel, a packet comprising the sensor event message and the associated sequence number.

2. The apparatus of claim 1, wherein the output of the packet comprises modulating the radio signal based on the select waveform profile.

3. The apparatus of claim 2, wherein the modulating the radio signal comprises modulating a digital representation of the select waveform profile.

4. The apparatus of claim 3, wherein the modulating the radio signal comprises converting to analog a modulated digital representation of a waveform resulting from the modulating the digital representation of the select waveform profile.

5. The apparatus of claim 2, wherein the modulating the radio signal comprises:
   converting a digital representation of a waveform to an analog representation of the waveform; and
   passing the analog representation of the waveform through an analog quadrature modulator.

6. The apparatus of claim 1, wherein the select waveform profile comprises a digital representation of a waveform of the radio signal.

7. The apparatus of claim 1, wherein the select waveform profile comprises an analog representation of a waveform of the radio signal.

8. The apparatus of claim 1, wherein the packet comprises a payload indicative of the sensor event message.

9. The apparatus of claim 8, wherein the packet comprises a payload checksum associated with the payload.

10. The apparatus of claim 1, wherein the controller is further configured to: determine a pseudo-random time offset, wherein the packet is output based on the pseudo-random time offset.

11. A method comprising: detecting, by a sensor device, a sensor event;
   determining, by a controller of the sensor device and based on the sensor event, a select sensor event message of a plurality of sensor event messages stored on a memory of the sensor device, wherein each of the plurality of sensor event messages is generated and stored with an associated sequence number in the memory prior to detection of the sensor event, wherein the associated sequence number is configured to indicate a relative place of the sensor event message in an ordered sequence of the plurality of sensor event messages to facilitate detection of a misuse of the sensor event message;
   determining, based on the select sensor event message, a select waveform profile;
   determining a select radio frequency channel based on a memory location associated with the select sensor event message of the select waveform profile; and
   outputting, via a radio signal that is output by the sensor device, a packet comprising the select sensor event message and the associated sequence number, wherein outputting the packet is based on the select waveform profile, and wherein the radio signal is output via the select radio frequency channel.

12. The method of claim 11, further comprising:
modulating the radio signal based on the select waveform profile.

13. The method of claim 12, wherein the modulating the radio signal comprises modulating a digital representation of the select waveform profile.

14. The method of claim 12, wherein the modulating the radio signal comprises converting to analog a modulated digital representation of a waveform resulting from the modulating digital representation of the select waveform profile.

15. The method of claim 11, further comprising:
determining a pseudo-random time offset, wherein the packet is output based on the pseudo-random time offset.

16. A system, comprising:
an application server; and
an apparatus in communication with the application server, the apparatus comprising:
  a memory storing:
    a plurality of sensor event messages;
    one or more waveform profiles, wherein each waveform profile of the one or more waveform profiles is associated with one of the plurality of sensor event messages; and
    a plurality of radio frequency channels;
  a sensor configured to determine a sensor event; and
  a controller configured to communicate with the memory and the sensor, wherein the controller is further configured to:
    select, based on the sensor event, a sensor event message of the plurality of sensor event messages, wherein each of the plurality of sensor event messages is generated and stored with an associated sequence number in the memory prior to detection of the sensor event, wherein the associated sequence number is configured to indicate a relative place of the sensor event message in an ordered sequence of the plurality of sensor event messages to facilitate detection of a misuse of the sensor event message;
    determine, based on the sensor event message, a select waveform profile of the one or more waveform profiles;
    determine, based on a memory location associated with the sensor event message of the select waveform profile, a select radio frequency channel from the plurality of radio frequency channels; and
    output, based on the select waveform profile, via a radio signal on the select radio frequency channel, a packet comprising the sensor event message and the associated sequence number.

17. The system of claim 16, wherein the controller is further configured to output the packet to the application server.

18. The system of claim 16, wherein the application server is configured to receive the packet and communicate information associated with the packet to an end user.

19. The system of claim 16, wherein the application server is configured to store information associated with the packet.

20. The system of claim 16, wherein the packet comprises a payload indicative of the sensor event message.

* * * * *